United States Patent [19]

Webb

[11] 4,380,114
[45] Apr. 19, 1983

[54] METHOD OF MAKING A SEMICONDUCTOR SWITCHING DEVICE

[75] Inventor: Monty F. Webb, Richardson, Tex.

[73] Assignee: Teccor Electronics, Inc., Irving, Tex.

[21] Appl. No.: 236,258

[22] Filed: Feb. 20, 1981

Related U.S. Application Data

[62] Division of Ser. No. 29,263, Apr. 11, 1979, abandoned.

[51] Int. Cl.³ .................. H01L 21/603; H01L 21/28; H01L 21/302; H01L 21/56
[52] U.S. Cl. ........................................ 29/588; 29/589; 29/590; 29/591; 357/38; 357/39; 357/71; 307/252 B
[58] Field of Search ................. 29/591, 590, 589, 588; 428/620; 228/110, 111; 307/252 B; 357/38, 39, 357/67, 68, 71

[56] References Cited

U.S. PATENT DOCUMENTS

| | | | |
|---|---|---|---|
| 2,603,693 | 6/1952 | Kircher | 428/620 X |
| 3,235,945 | 2/1966 | Hall et al. | 228/110 X |
| 3,364,399 | 1/1968 | Warner | 29/590 X |
| 3,581,386 | 6/1971 | Dale et al. | 29/590 |
| 3,620,692 | 11/1971 | Franklin et al. | 428/620 |
| 3,698,074 | 10/1972 | Helda et al. | 29/589 X |
| 3,855,611 | 12/1974 | Neilson et al. | 357/38 |
| 3,896,480 | 7/1975 | Harnden, Jr. | 357/80 |
| 3,919,709 | 11/1975 | Koenig | 29/589 X |
| 3,964,091 | 6/1976 | Berndes et al. | 357/39 |
| 4,052,624 | 10/1977 | Hamstra | 307/252 B |
| 4,063,277 | 12/1977 | Gooen | 357/38 |
| 4,083,063 | 4/1978 | Yu | 357/38 |

FOREIGN PATENT DOCUMENTS

55-121656  9/1980  Japan ................................. 29/590

Primary Examiner—M. J. Andrews
Assistant Examiner—Alan E. Schiavelli
Attorney, Agent, or Firm—Hubbard, Thurman, Turner & Tucker

[57] ABSTRACT

A triac device includes a first silicon chip having regions of alternate conductivity type disposed in a PN-junction forming relationship which defines a center-fired triac. A second silicon chip having regions defining a diac is bonded to the gate region of the triac chip. A copper layer of about 1 to 5 mils in thickness is bonded to the portions of the top major face of the triac chip that surround the gate region. Cathode, anode and gate connections are provided to the two-chip subassembly which is then encapsulated. The copper layer permits a smaller cathode connection to be made to the top of the triac chip without reducing the current capacity of the device.

The triac device is mass-produced by first forming a plurality of triac chips in a two-dimensional array in a large area silicon wafer. The copper layers and diac chips are formed on the wafer prior to its separation into separate diac-triac chip subassemblies.

4 Claims, 12 Drawing Figures

METHOD OF MAKING A SEMICONDUCTOR SWITCHING DEVICE

This is a division of application Ser. No. 29,263, filed Apr. 11, 1979 now abandoned.

This invention pertains generally to semiconductor devices and more particularly to a process for fabricating a plurality of semiconductor chips from a semiconductor wafer and encapsulating the individual chips in discrete packages. Most particularly, the invention is concerned with improvements in forming electrical contacts to a semiconductor triac chip prior to its encapsulation.

A prior art device an preferred embodiment of the invention are described below with reference to the accompanying drawings, in which.

Figure 1:
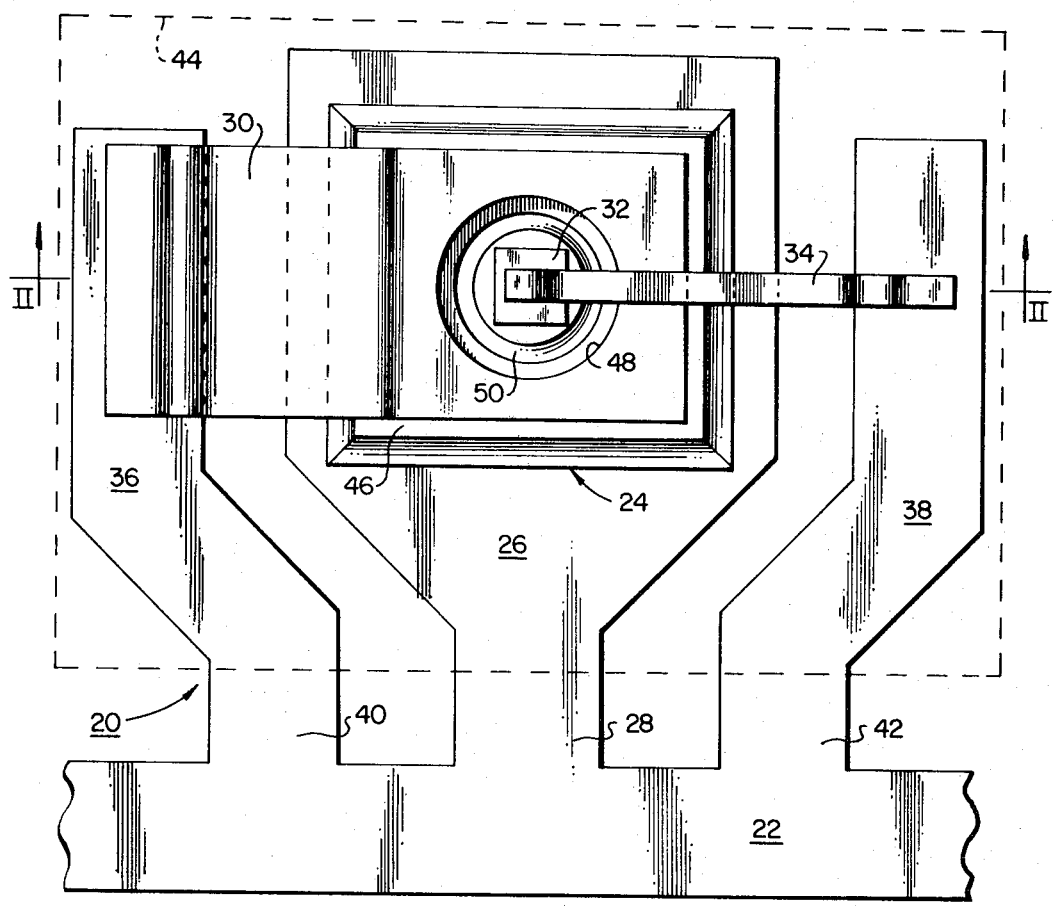
FIG. 1 is a schematic plan view of a semconductor device of the prior art.
Figure 2:
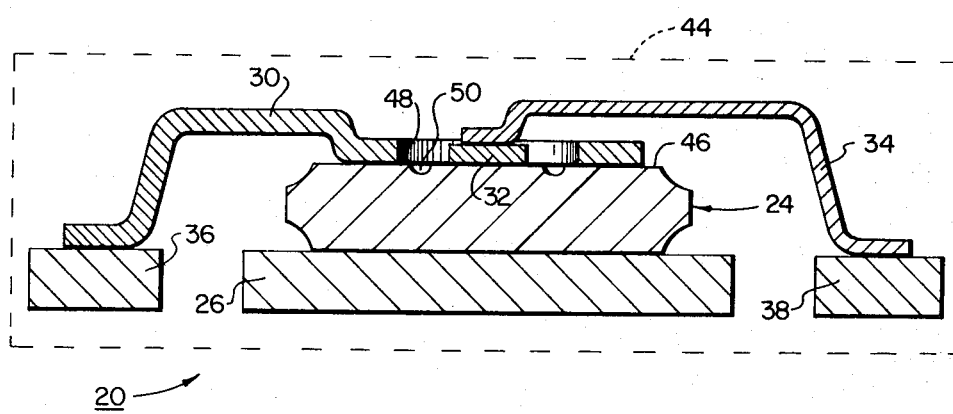
FIG. 2 is a schematic view in cross section of the device of FIG. 1 taken along line II—II.

Referring to FIGS. 1 and 2, a device of the prior art is illustrated and designated generally by reference numeral 20. During assembly, the device 20 and a plurality of similar devices are supported on a lead frame 22 in a conventional manner. In this example, the device 20 is a three-terminal switching device commonly known as a triac, the principal element of which is a semiconductor chip 24. The triac chip 24 is preferably soldered to a header plate or anode terminal 26, which has a narrow extension 28 adjoining the lead frame 22. Soldered to the upper surface of the chip 24 is a cathode lead 30. Centrally disposed atop the triac chip 24 is a trigger element or diac chip 32, which has a breakdown voltage of about 30 volts for controlling the firing of the triac chip 24 as will be appreciated by those skilled in the art. Firing or triggering of the device 20 is achieved by means of a gate lead 32, which is soldered to the top of the diac chip 32 in the indicated manner. The cathode lead 30 and the gate lead 32 extend in opposite directions from the triac chip 24 to contact respectively a cathode terminal 36 and a gate terminal 38. Like the anode terminal 26, the cathode terminal 36 and gate terminal 38 have respective extensions 40 and 42 adjoining the common lead frame 22. Once the various interconnections have been made, the device 20 is encapsulated in a suitable manner, such as by injection molding with plastic. An outline of a plastic case or package formed in such manner is indicated by the dashed line 44 in FIGS. 1 and 2. After encapsulation, the device 20 is separated from the lead frame 22 by severing the terminal extensions 28, 40 and 42 between the lead frame 22 and the adjacent edge of the package 44.

In order to achieve good electrical and thermal contact to the top surface 46 of the triac chip 24, it has been the practice in the prior art to contact as much as the top surface 46 with the cathode lead 30 as practical tolerances will permit. Thus, it will be seen that the cathode lead 30 is provided with a central aperture 48 within which the diac chip 32 is located. It will be appreciated that a glass-filled moat 50 is typically provided in the traic chip 24 around the diac chip 32 in devices of this type in order to isolate the central gate region of the top surface 46 from the surrounding surface area contacted by the cathode lead 30.

Figure 3:
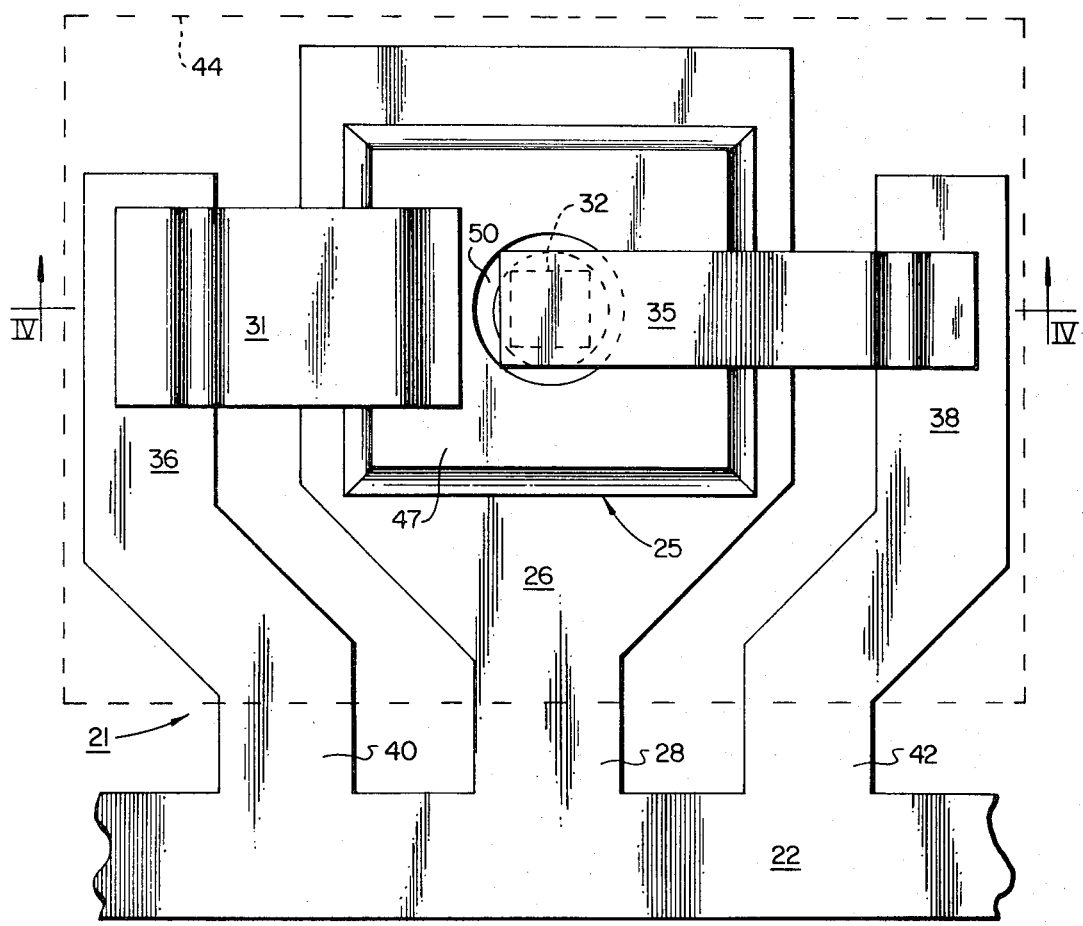
FIG. 3 is a schematic plan view of a semiconductor device of the present invention.
Figure 4:
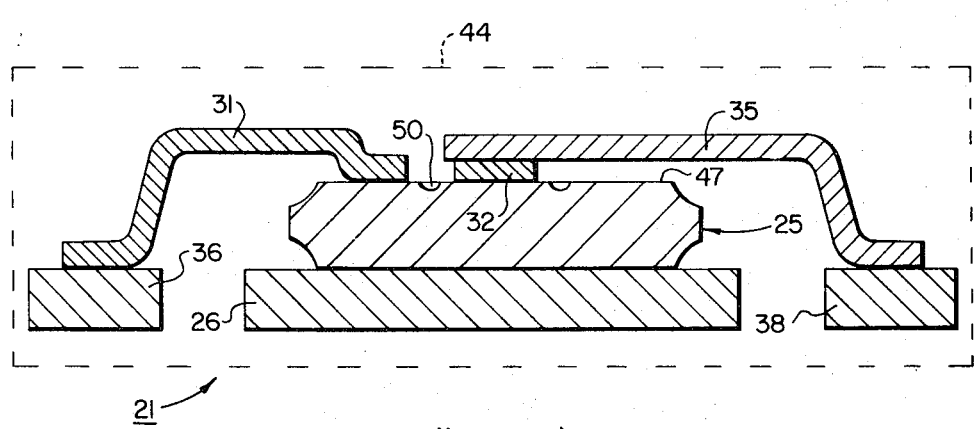
FIG. 4 is a schematic view in cross section of the device of FIG. 3 taken along line IV—IV.

Now referring to FIGS. 3 and 4, a device of the present invention is illustrated and designated generally by reference numeral 21. The device 21 is similar in many respects to the prior art device 20. Accordingly, like parts are designated by like reference numerals. It will be readily apparent, however, that the device 21 has a cathode lead 31 and a gate lead 35 which differ from those of the prior art device 20. The different arrangement of the leads 31 and 35 is made possible by an improved triac chip 25, the pertinent surface details of which will be described below with reference to FIG. 5. The cathode lead 31 is adapted to contact a comparatively small area of the top surface 47 of the triac chip 25. In the present example, the cathode lead 31 contacts only about 20 percent of the available area of the top surface 47. In the orientation of the device 21 shown in FIGS. 3 and 4, the cathode lead 31 contacts only a left portion of the top surface 47 of the traic chip 25. Clearly, a much greater tolerance is permitted in properly locating the cathode lead 31 on the triac chip 25 in comparison with the prior art arrangement of FIGS. 1 and 2. Likewise, as will be appreciated best from the view of FIG. 3, greater tolerance in connecting the gate lead 35 to the the diac chip 32 is permitted since the gate lead 35 can be made comparatively much wider without risk of shorting to the cathode lead 31. In addition to reduced labor costs, such greater tolerances promote improved device yields.

Figure 5:
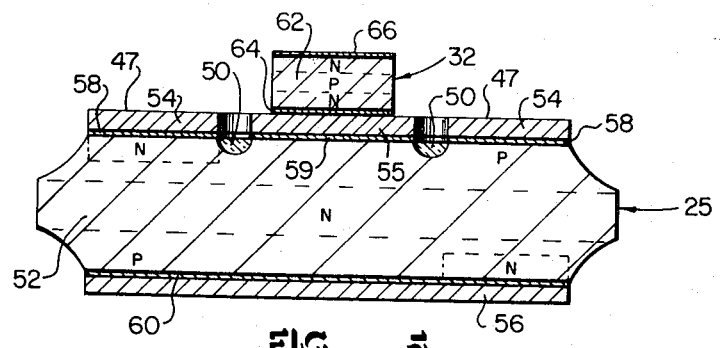
FIG. 5 is an enlarged schematic view of a diac-triac chip subassembly of FIG. 4 showing additional surface details.

In accordance with an important feature of the present invention, the foregoing advantageous lead arrangements of the device 21 are accomplished with no appreciable reduction in device performance as will become apparent from the following description with reference to FIG. 5 of the improved triac chip 25. In the preferred embodiment of the device 21, the triac chip 25 comprises a main body of monocrystalline silicon 52 having copper layers 54 and 55 disposed on the top major face of the silicon body 52 and a copper layer 56 disposed on the bottom major face thereof. The copper layers 54, 55, and 56 are bonded to the silicon body 52 by means of solder layers 58, 59, and 60, respectively. With the exception of the area directly over the moat 50, substantially the entire remaining top surface of the silicon body is covered by the copper layers 54 and 55. Substantially the entire bottom major face of the silicon body 52 is covered by the bottom copper layer 56. The diac chip 32 comprises a monocrystalline silicon body 62 which is bonded to the triac silicon body 52 by means of a solder layer 64. The top major face of the diac silicon body 62 is covered by a solder layer 66 in preparation for bonding to the gate lead 35 in the manner seen in FIG. 4. The enlarged view of FIG. 5 of the assembly of the chips 25 and 32 expressly illustrates the various N-type and P-type regions within the respective silicon bodies 52 and 62. It will be appreciated that these various regions, which are delineated by the dashed lines, can be provided in the silicon bodies 52 and 62 using conventional impurity doping techniques. It will also be appreciated that the peripheral edges of the silicon bodies 52 and 62 are protected in a suitable manner, such as by means of conventional glass passivation layers (not shown).

Although the bonding of copper to silicon can present problems due to the substantial difference between the coefficient of thermal expansion of copper and silicon, such problems will not appear if the copper is relatively thin and if the size of the copper-silicon interface is kept relatively small. In the case of the preferred device 21, it has been found that a square silicon chip 25 measuring 140 to 140 mils and having a 7 to 10 mil thickness performs well with no evidence of unusual thermal fatigue using copper layers 54 and 56 of approximately 1 to 5 mils in thickness. It is presently preferred that 1.4 mil thick copper layers 54 and 56 be used with presently described triac device 21, which has been found to have equal or superior current surge, voltage drop and heat dissipation characteristics compared to the prior art device 20. These performance characteristics are accomplished with a contact area measuring about 30 by 90 mils between the cathode lead 31 and the top surface 47 of the triac chip 25. In the present example, therefore, an alignment tolerance of about plus or minus 20 mils in the vertical direction and about plus or minus 10 mils in the horizontal direction in the view of FIG. 3 exists between the cathode lead 31 and the triac chip 25. In the prior art device 20, a tolerance of no more than plus or minus 5 mils is available in either direction.

Figure 6:
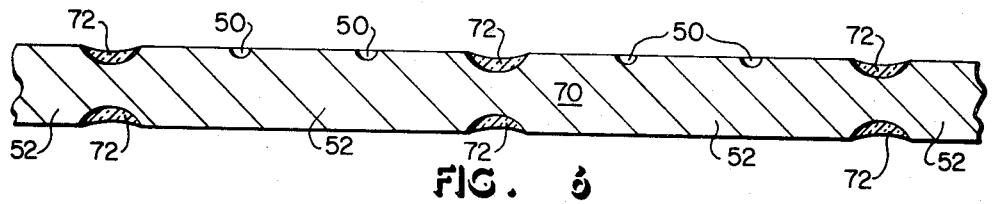
FIGS. 6–9 are schematic views in cross section of a portion of a semiconductor wafer during steps in a process for fabricating semiconductor devices in accordance with the present invention.
Figure 7:
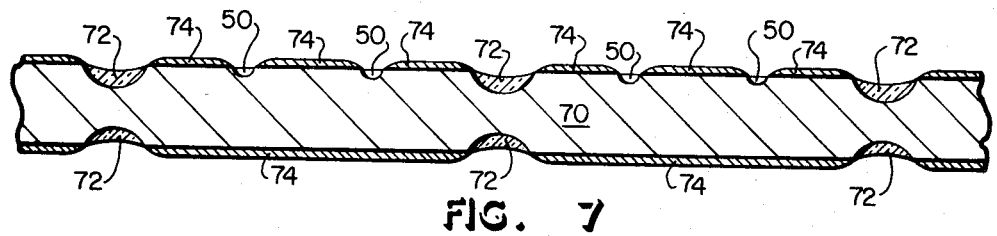
Figure 8:
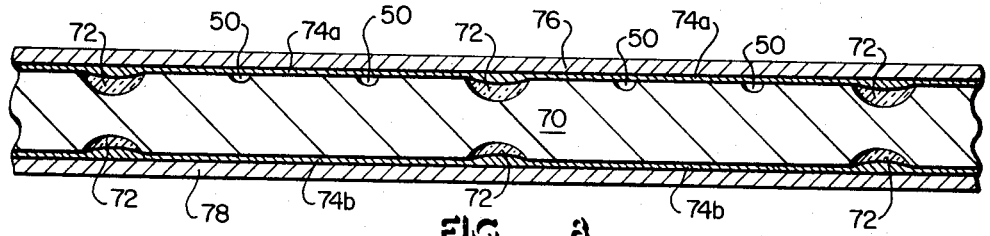
Figure 9:
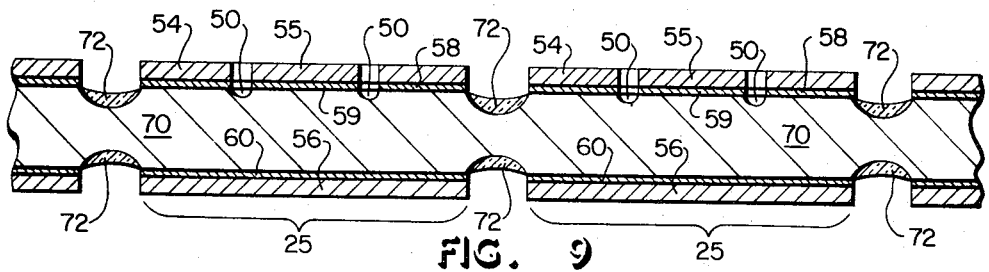

Now referring to FIGS. 6–12, a preferred process for making the device 21 will now be described. With particular reference to FIG. 6, a portion of a silicon slice or wafer 70 is illustrated at a stage in the inventive process wherein a plurality of appropriately doped silicon bodies 52 are defined between glass-filled moats 72. The wafer 70 is then dipped in molten solder which adheres in mounds 74 to the exposed silicon surfaces of the wafer 70 as depicted in FIG. 7. Then, as seen in FIG. 8, copper foils 76 and 78 of the desired thickness are uniformly pressed onto the opposite sides of the wafer 70 causing the molten solder to flow laterally over the glassed portions 50 and 72 of the wafer 70. Any excess solder flows out around the edges (not shown) of the wafer 70, thus providing solder bonding layers 74a and 74b that are as thin as possible. Using this technique, the solder layers 74a and 74b can be made several times thinner than the respective copper layers 76 and 78. Once the structure of FIG. 8 has cooled, it is subjected to selective etching using conventional photoresist masking techniques to remove portions of the copper and solder to provide the structure depicted in FIG. 9. By comparison with FIG. 5, it will be seen that FIG. 9 illustrates two full traic chips 25 side by side in the wafer 70 with separate copper layers 54, 55 and 56 and separate solder layers 58, 59, and 60.

Figure 10:
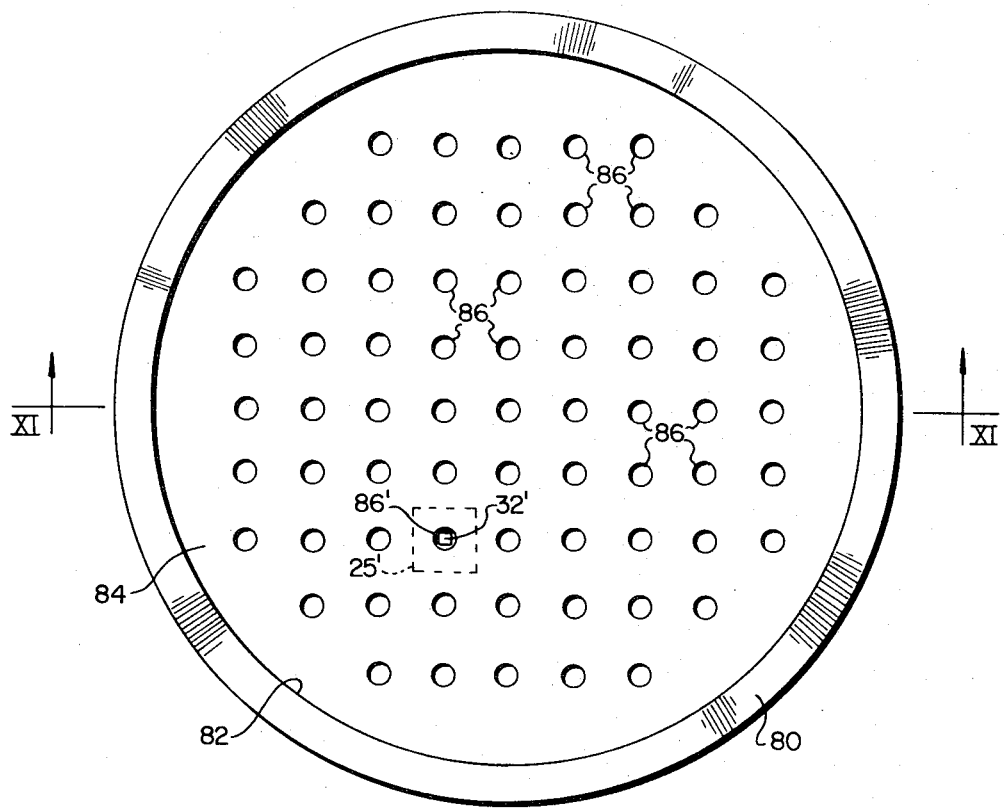
FIG. 10 is a schematic plan view of a jig and mask assembly employed durng the aforementioned inventive process.
Figure 11:
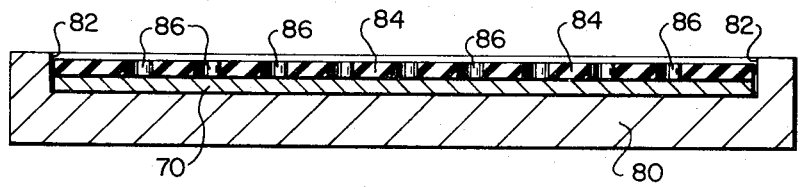
FIG. 11 is a schematic view in cross section of the assembly of FIG. 10 taken along line XI—XI.
Figure 12:
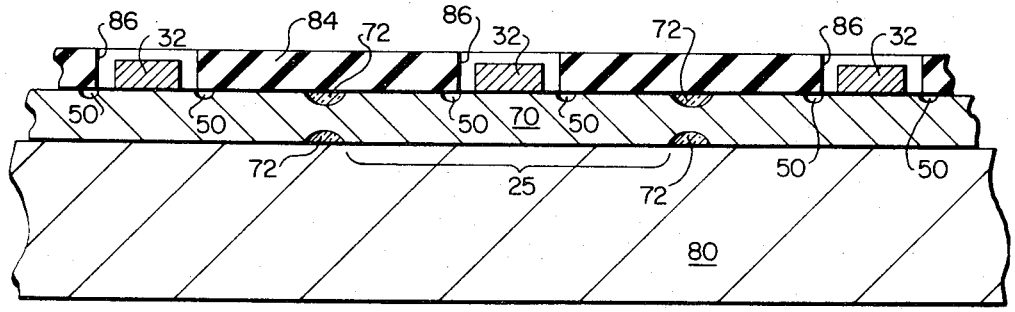
FIG. 12 is an enlarged schematic fragmentary view in cross section similar to FIG. 11 but at a subsequent stage in the process.

In accordance with an important feature of the inventive process, the diac chips 32 are assembled on the wafer 70 prior to breaking the wafer 70 into separate triac chips 25, which are previously described in conjunction with FIG. 5. Referring to FIGS. 10 and 11, a cup-like jig 80 is used as a carrier and alignment tool during the process of bonding the diac chips 32 to the wafer 70. It will be appreciated that for convenience of illusration the details of the copper layers 54, 55 and 56 and associated solder layers 58, 59 and 60 of FIG,. 9 are not expressly shown as part of the wafer 70 in FIG. 11 but it will be understood that such copper and solder layers are present nonetheless. The wafer 70 is placed in a cylindrical recess 82 in the jig 80 and a loading mask or sheet 84 is placed over the wafer 70 as depicted in FIG. 11. The mask 84 includes a plurality of circular openings 86 in a predetermined pattern as exemplified in FIG. 10. Each opening 86 has a diameter of about 60 mils so that it will readily receive one of the diac chips 32, which is preferably square due to conventional chip making techniques and measures about 40 by 40 mils. The position of a typical one of many triac chips to be formed from the wafer 70 is indicated by the dashed square zone 25' in FIG. 10. A typical opening 86' is seen registered over the center of the triac chip 25'. Thus, dropping a diac chip 32' into the opening 86' will automatically provide proper alignment between the triac chip 25' and its respective diac chip 32' prior to their being bonded together. It will be appreciated that the openings 86 are patterned to register with the various underlying triac gate regions on the top surface of the wafer 70.

The wafer 70 and mask 84 preferably have the same diameter which in turn is just slightly smaller than the diameter of the cylindrical recess 82. Once the wafer 70 and mask 84 are properly oriented in the jig 80, diac chips 32 are then loaded into each of the openings 86 using a conventional vibrating platform (not shown) to "shaker load" the diac chips 32 onto the desired positions on the wafer 70 as depicted in the enlarged view of FIG. 12. For best results, the mask 84 should have about the same thickness as the typical diac chip 32, which in this example is preferably about 5 mils. Both major faces of each diac chip 32 are presoldered so that it is only necessary to heat the assembled parts at this stage in order to bond the diac chips 32 to the wafer 70. It will of course be appreciated that the diac chips 32 are electrically bidirectional so that it does not matter which of the two sides of each one of such chips 32 becomes bonded to the wafer 70. In the presently preferred process, the jig 80 and associated parts therein are heated to a temperature of about 300° C. in order to solder the diac chips 32 in the openings 86 to the wafer 70. Accordingly, the masking sheet 84 is formed from a material resistant to relatively high temperatures, such as the polyimide resin known as Kapton. After the wafer 70 has cooled, it can be scribed and broken along the glassed portions 72 in a conventional manner to provide separate triac chips 25 having the structure shown in FIG. 5. Like FIGS. 4 and 11, FIG. 12 does not expressly show the copper layers 54, 55 and 56 which are actually present as will be appreciated from the view of FIG. 5. It will also be appreciated that preliminary testing of individual triac chips 25 can be performed prior to scribing and breaking of the wafer 70.

It will be apparent from the foregoing description of the present invention that many advantages and improvements over the prior art are achieved. The application of the relatively thick copper layer 54 on the top major face of the triac chip 25 as shown in FIG. 5 enables the full-rated current of the prior art device 20 to be drawn through a relatively small area interface between the triac chip 25 and the cathode lead 31. This advantage permits the employment of the non-critically positioned arrangement of leads 31 and 35 shown in FIGS. 3 and 4 in comparison with the close lead-chip alignment required by the prior-art device 20 of FIGS. 1 and 2. The unique method of applying the copper foils 76 and 78 to the wafer 70 as shown in FIG. 8 enables copper layers 54 and 56 having thickness in excess of 1 mil to be provided where prior-art sputtering and evaporation techniques as a practical matter can only achieve a maximum thickness of about 0.1 to 0.2 mils. A device having the arrangement of the cathode lead 31 shown in FIGS. 3 and 4 would exhibit a significant drop in current capacity if only 0.1 to 0.2 mils of copper were applied to the top of the triac chip 25 instead of the 1 to 5 mils applied by the present method. It will also be appreciated that the relatively thick copper layer 56 on the bottom of the triac chip 25 advantageously reduces the thermal resistance between the chip 25 and the relatively massive anode terminal 26.

Another important advantage of the present invention is that the process of assembling the chips 25 and 32 and the leads 31 and 35 prior to encapsulation is greatly simplified by providing a subassembly of the diac chip 32 bonded to the triac chip 25. Thus, the diac chip 32 serves as an elevated stand-off above the surrounding surface 47 of the triac chip 25 to provide an easy target for the gate lead 35 during assembly.

These and other advantages of the present invention will readily be appreciated by those skilled in the art. Although a specific example of the invention has been described in detail, it is to be understood that various modifications, substitutions, and alternatives can be made therein without departing from the spirit and scope of the invention as defined by the appended claims.

What is claimed is:

1. A method of making a semiconductor switching device comprising:
    providing a semiconductor wafer having a plurality of defined zones arranged in a two-dimensional array, each zone having a plurality of regions of alternate conductivity type constructed and arranged to permit one of said semiconductor switching devices to be formed from the semiconductor chip defined by one of said zones once separated from the wafer;
    applying molten solder to said wafer;
    applying a copper foil having a thickness of approximately 1 to 5 mils over the solder covering at least one major face of the wafer;
    uniformly pressing the copper foil and wafer together with sufficient force to cause the molten solder to flow laterally and then harden to a uniform thickness, said solder thickness being several times thinner than the thickness of said copper foil;
    selectively etching away portions of said copper foil and underlying solder along the boundaries of said zones and in gate regions defined in each zone;
    bonding a trigger element to the gate region within each zone;
    breaking said wafer along the boundaries between zones to provide separate semiconductor chips;
    bonding one of said chips onto a terminal;
    bonding a cathode lead to a portion of said copper foil atop said chip;
    bonding a gate lead atop said trigger element; and
    encapsulating said chip, trigger element, terminal and leads.

2. A method of claim 1 further comprising the steps following the etching step of:
    aligning a mask over said wafer, said mask having openings which register with said gate regions within each zone; and
    shaker-loading said trigger elements through said mask openings onto to said gate regions.

3. The method of claim 2 wherein said mask comprises a sheet of polyimide resin and said mask is not removed from said wafer until said trigger elements are bonded to said wafer.

4. The method of claim 3 wherein said trigger elements are presoldered prior to said shaker-loading step and bonding of said trigger elements to said wafer is accomplished by heating the wafer to about 300° C.

* * * * *